(12) United States Patent
Saito et al.

(10) Patent No.: US 7,271,477 B2
(45) Date of Patent: Sep. 18, 2007

(54) POWER SEMICONDUCTOR DEVICE PACKAGE

(75) Inventors: Wataru Saito, Kanagawa (JP); Ichiro Omura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 525 days.

(21) Appl. No.: 10/867,758

(22) Filed: Jun. 16, 2004

(65) Prior Publication Data

US 2005/0224945 A1   Oct. 13, 2005

(30) Foreign Application Priority Data

Apr. 9, 2004   (JP) .............................. 2004-115728

(51) Int. Cl.
*H01L 23/02* (2006.01)
(52) U.S. Cl. ..................................... 257/686
(58) Field of Classification Search ................. 257/620, 257/686–690, 777, E25.006
See application file for complete search history.

(56) References Cited

U.S. PATENT DOCUMENTS 6,426,560 B1 * 7/2002 Kawamura et al. ......... 257/777
6,707,138 B2 * 3/2004 Crowley et al. ............ 257/676
7,030,501 B2 * 4/2006 Yoshiba et al. ............. 257/777
2003/0042437 A1 * 3/2003 Worley et al. .............. 250/551
2003/0075785 A1 * 4/2003 Crowley et al. ............ 257/676

FOREIGN PATENT DOCUMENTS

| JP | 2002-208673 | 7/2002 |
|----|-------------|--------|
| JP | 2002-217416 | 8/2002 |
| JP | 2003-197859 | 7/2003 |

* cited by examiner

*Primary Examiner*—Nathan W. Ha
(74) *Attorney, Agent, or Firm*—Oblon, Spivak, McClelland, Maier & Neustadt, P.C.

(57) ABSTRACT

A power semiconductor device package according to one aspect of the present invention comprises: a plurality of power semiconductor chips which are arranged in a laminated structure so that the plurality of power semiconductor chips are opposing to each other at the surfaces with the same electrical structures, and which are connected in parallel to one another, and are sealed in a sealing resin as one body.

15 Claims, 7 Drawing Sheets

POWER SEMICONDUCTOR DEVICE PACKAGE

CROSS REFERENCE TO RELATED APPLICATION

The subject application is related to subject matter disclosed in Japanese Patent Application No. 2004-115728 filed on Apr. 9, 2004 in Japan to which the subject application claims priority under Paris Convention and which is incorporated herein by reference.

BACKGROUND OF THE INVENTION

1. Field of the Invention

The present invention relates to a power semiconductor device package.

2. Related Background Art

The size and the power loss of a power supply circuit have been reduced along with the development and improvement of the power semiconductor device. The conduction loss of, especially, an AC adapter and the like has been decreased by reducing the on-resistance of a power metal oxide semiconductor field-effect transistor (power MOSFET) which is a switching element mainly used as one of components, and reduction in the power loss of the adapter and the like has been realized.

Since the on-resistance of the power MOSFET is inversely proportional to the area of a chip, use of a power MOSFET chip with a large chip area is required in a power supply circuit with a large rated current. Moreover, the size of a chip which a package can accommodate depends on the size of the package.

Accordingly, the size of a package which accommodates chips of MOSFETs with a large rated current and a low on-resistance is forced to be large.

Here, in a conventional technology, a semiconductor device in which a plurality of semiconductor chips which have different functions from one another are packaged as a laminated structure in order to control increase in the size of the package, to simplify the manufacturing processes, and the like has been proposed, and has become publicly known. In this connection, reference will be made to, for example, Japanese Patent Laid-Open Publication NO. 2002-208673, Japanese Patent Laid-Open Publication NO. 2003-197859, and Japanese Patent Laid-Open Publication NO. 2002-217416.

However, one package accommodates only one semiconductor chip in a conventional semiconductor device package, except a semiconductor device in which a plurality of semiconductor chips with different functions from one another are packaged as a laminated structure.

Since the size of a chip which a package can accommodate depends on the size of the package as described above, the package size, that is, the size of a lead frame is decided, and, then, a maximum chip area which the package can accommodate is decided according to the decision.

Moreover, since the on-resistance of a power MOSFET is inversely proportional to the chip area, a minimum on-resistance is decided by the maximum chip area which the package can accommodate.

On the other hand, the capacity of a power supply circuit has been increased in addition to the reduction of the size and the power loss of a power supply circuit so that the power supply circuit with a large output capacity and a high rated current has been used.

The conduction loss generally becomes large along with the increase in the output capacity and the rated current of the power supply circuit. Accordingly, a power MOSFET chip with small on-resistance, that is, a power MOSFET chip with a large area is required to be used in order to prevent or control the increase in such a conduction loss.

Therefore, a power MOSFET with a large package size has been forced to be used in order to prevent or control the increase in the conduction loss caused by the increase in the output capacity and the rated current of the power supply circuit in a conventional technology.

As a result, it has been difficult to reduce the size of a power supply circuit because the package size of a power MOSFET is increased as the capacity of the power supply circuit becomes large.

SUMMARY OF THE INVENTION

According to one aspect of the present invention, there is provided a power semiconductor device package which comprises: a plurality of power semiconductor chips which are arranged in a laminated structure so that the plurality of power semiconductor chips are opposing to each other at the surfaces with the same electrical structures, and which are connected in parallel to one another and are sealed in a sealing resin as one body.

DETAILED DESCRIPTION OF THE EMBODIMENTS

Embodiments of a power semiconductor device package according to the present invention will be hereinafter explained, referring to drawings. Here, components same or similar to one another are denoted by the same reference numbers.

Figure 1:
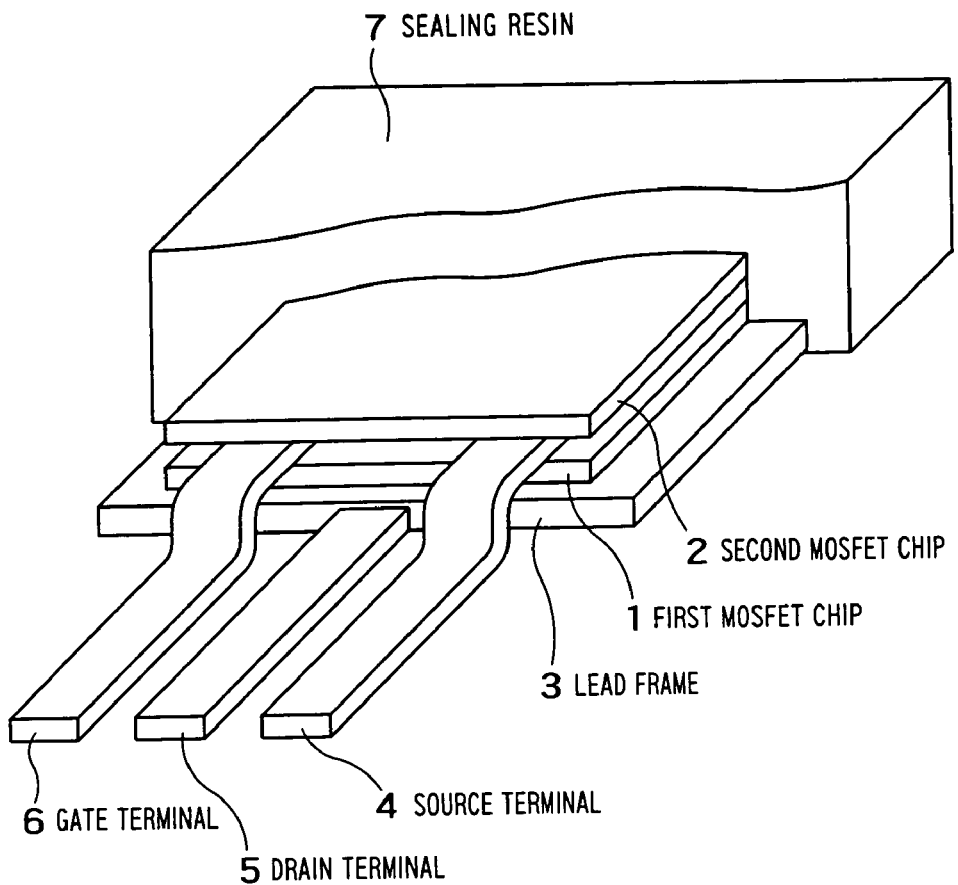
FIG. 1 is a partial cutaway perspective view showing the structure of a power semiconductor device package according to a first embodiment of the present invention.
Figure 2:
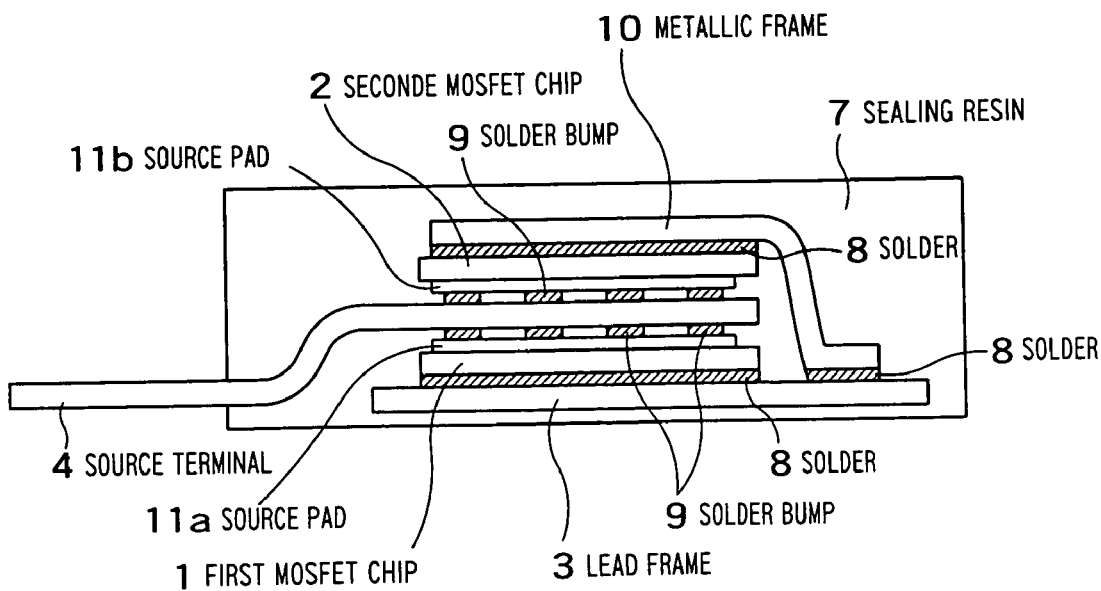
FIG. 2 is a cross sectional view showing the structure of the power semiconductor device package according to the first embodiment of the present invention.

FIG. 1 is a partial cutaway perspective view showing the structure of a power semiconductor device package according to a first embodiment of the present invention, and FIG. 2 is a cross sectional view showing the structure of the power semiconductor device package according to the first embodiment of the present invention.

The power semiconductor device package according to the first embodiment of the present invention comprises: a lead frame 3; a first power MOSFET chip 1 which is mounted on the lead frame 3 with solder 8 as a thermoplastic conductive member; a drain terminal 5 which is extended from the lead frame 3, and connected to a drain electrode on the back of the first power MOSFET chip 1; a source pad 11a and a gate pad (not shown) formed on the first power MOSFET chip 1; a source terminal 4 and a gate terminal 6 in each of which one side is connected to the source pad 11a and the gate pad on the first power MOSFET chip 1 with solder bumps 9 as a thermoplastic conductive member, respectively; a second power MOSFET chip 2 which is connected to the first power MOSFET chip 1 in parallel by connecting a source pad 11b and a gate pad (not shown) formed on the surface to the other side of the source terminal 4 and the gate terminal 6 with solder bumps 9, respectively, and a drain electrode on the back to the lead frame 3 with a metallic frame 10 and the solder 8, and is arranged opposing to the first power MOSFET chip 1; and a sealing resin 7 in which components are sealed in a state that the tips of the source terminal 4, gate terminal 6, and drain terminal 5 are exposed.

In other words, the power semiconductor device package according to the first embodiment of the present invention comprises two power MOSFET chips, that is, the first and second power MOSFET chips 1 and 2 which are connected in parallel with each other by common connection of electrode wirings to the electrode wiring metallic plates 4 and 6, while the power MOSFET chips are arranged as a laminated structure, sandwiching the electrode wiring metallic plates 4 and 6 between the MOSFET chips, and opposing to each other, and are sealed in the sealing resin 7 as one body.

The first and second power MOSFET chips 1 and 2 have similar functions to each other, are operated in synchronization with each other, and are connected to each other in parallel. Accordingly, the first and second power MOSFET chips 1 and 2 are connected to all of the source terminal 4, gate terminal 6, and drain terminal 5 as external electrode terminals, respectively.

The first and second power MOSFET chips 1 and 2 are mounted on the lead frame 3, while they are arranged in the laminated structure as described above, and are sealed in the sealing resin 7 as one body.

Moreover, when the first and second power MOSFET chips 1 and 2 are a vertical MOSFET, the source pad and the gate pad are formed on the side of the chip surface, and the drain electrode is formed on the back of the chip.

A source electrode wiring and a gate electrode wiring are extended by connecting the source pads 11a, and 11b, and the gate pads to the source terminal 4 and the gate terminal 6, respectively through the solder bumps 9 formed on the source pads 11a, and 11b, and the gate pads on the surfaces of the first and second power MOSFET chips 1 and 2, respectively.

Moreover, the drain electrode on the back of the first power MOSFET chip 1 is extended to the lead frame 3 by mounting the first power MOSFET chip 1 on the lead frame 3 with the solder 8, and the drain electrode on the back of the second power MOSFET chip 2 is extended to the lead frame 3 by connecting the back of the second power MOSFET chip 2 to the lead frames 3 through the metallic frames 10 and the solder 8.

As described, the temperature environment for both chips becomes similar by putting the first and second power MOSFET chips 1 and 2 in close vicinity for sealing them in the sealing resin 7 as one body, and the thermal resistance of the first power MOSFET chip 1 can have the similar one to that of the second power MOSFET chip 2.

Accordingly, parallel operations of the first and second power MOSFET chips 1 and 2 can be ideally realized.

Figure 3:
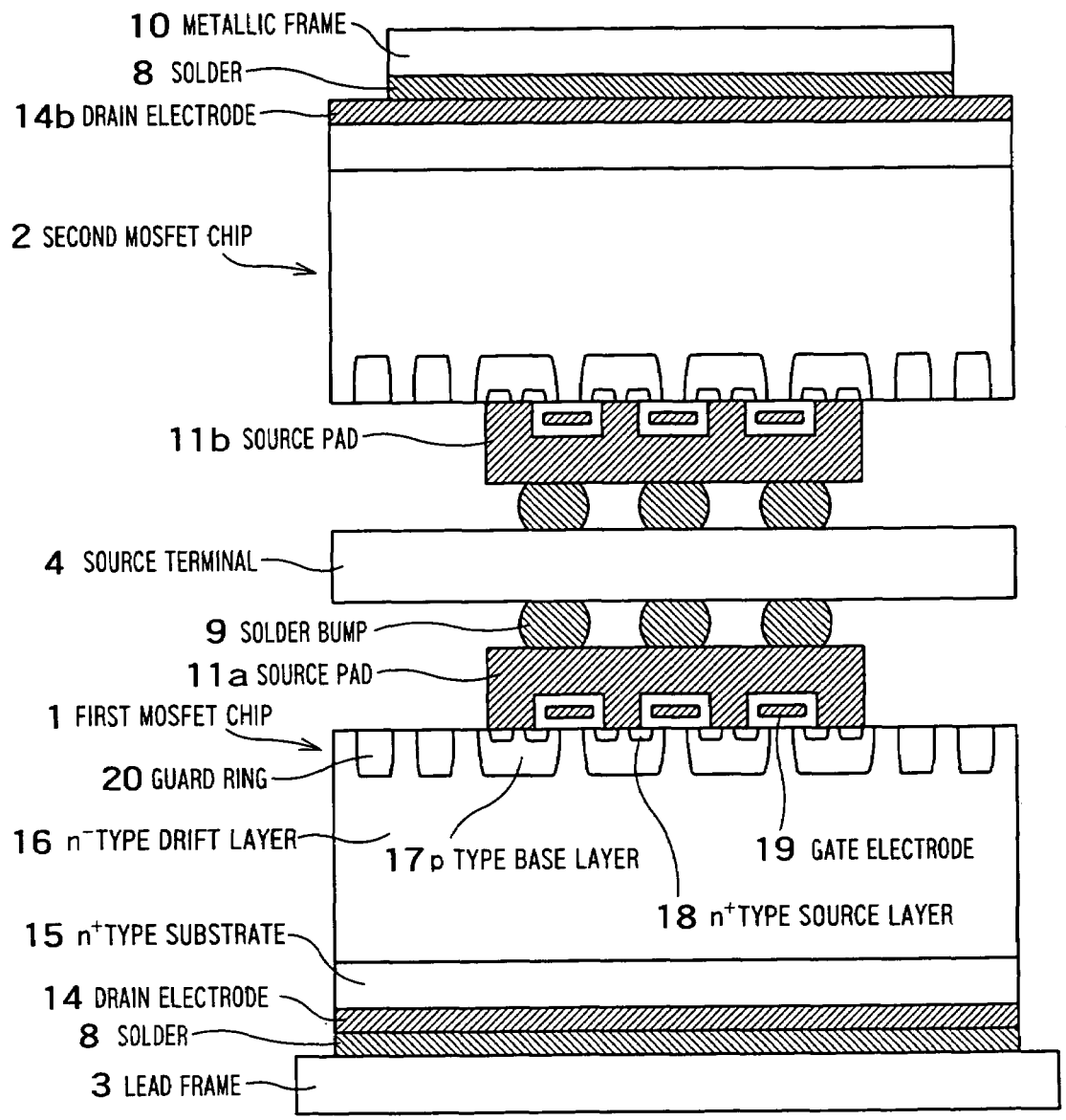
FIG. 3 is a partial sectional view showing one example of the structure of the power semiconductor device package according to the first embodiment of the present invention in more detail.

FIG. 3 is a partial sectional view showing one example of the structure of the power semiconductor device package according to the first embodiment of the present invention in more detail. Here, FIG. 3 shows a sectional view of the structure for a part including two power MOSFET chips, which are sealed in the sealing resin, in the power semiconductor device package according to the first embodiment of the present invention.

The sectional view in FIG. 3 shows details of the cross sectional structure for the part including two power MOSFET chips 1 and 2 when the power MOSFETs formed on the first and second power MOSFET chips 1 and 2 are of a vertical MOSFET.

The first power MOSFET chip 1 comprises an n+ type substrate 15; an n– type drift layer 16 formed on the n+ type substrate 15; p type base layers 17 formed in the surface portion of the n– type drift layer 16; n+ type source layers 18 formed in the surface portion of the p type base layer 17; gate electrodes 19 which are formed via insulating films from regions on n+ type source layers 18 formed in the surface portion of one p type base layer 17 to a region on another n+ type source layer 18 formed on the surface portion of another p type base layer 17 adjacent to the above p type base layer 17 via the n– type drift layer 16; a source pad 11a formed so that the pad 11a is connected to the n+ type source layers 18; solder bumps 9 formed on the source pad 11a; a drain electrode 14 which is formed on the back of the n+ type substrate 15 and is connected to the lead frame 3 with a solder 8; and guard rings 20 formed in the surface portion of the n– type drift layer 16 surrounding the element regions.

The second power MOSFET chip 2 also has a similar structure to that of the first power MOSFET chip 1, and a drain electrode 14b of the second power MOSFET chip 2 is connected to the lead frame 3 through the metallic frame 10 and the solder 8.

The surface sides of the first and second power MOSFET chips 1 and 2 are arranged so that they are opposing to each other, and sandwiching the source terminal 4 and the gate terminal 6 (refer to FIG. 1) between the both chips, and the source pads 11a and 11b, and the gate pads are connected to the source terminal 4 and the gate terminal 6 with the solder bumps 9. Thereby, the first and second power MOSFET chips 1 and 2 are connected in parallel to each other, and the source electrode wiring and the gate electrode wiring are extended to external terminals. Moreover, the drain terminal 5 (refer to FIG. 1) is connected to the lead frame 3, and, thereby, the drain electrode wiring is extended to an external terminal.

Here, the power MOSFETs on each power MOSFET chip can be of the vertical MOSFET shown in FIG. 3, even in power semiconductor device package according to other embodiments of the present invention which will be described later, in addition to the power semiconductor device package according to the first embodiment of the present invention.

Though the electrode wiring metallic plates 4 and 6 are configured to be sandwiched between the two power MOSFET chips in FIG. 3, each power MOSFET can be similarly of a vertical MOSFET even when the electrode wirings are directly connected by solder bumps and the like without sandwiching the electrode wiring metallic plates 4 and 6 between them. Moreover, though only the cross sectional structure for the part including two power MOSFET chips is shown in FIG. 3, each power MOSFET can be similarly of a vertical MOSFET even when three power MOSFET chips are arranged in a laminated structure and are sealed in a sealing resin as one body as described later.

As described above, since there is adopted the structure comprising the first and second power MOSFET chips 1 and 2 which are connected in parallel with each other by common connection to the above electrode wiring metallic plates 4 and 6, while the power MOSFET chips are arranged as a laminated structure, sandwiching electrode wiring metallic plates 4 and 6 between the MOSFET chips, and the two chips are sealed in the sealing resin 7 as one body, the on-resistance for the whole power semiconductor device as a single package can be reduced by half, assuming that the size of the package is hardly increased and the chip areas of the power MOSFET chips are approximately doubled, according to the power semiconductor device package of the first embodiment of the present invention.

Therefore, a power semiconductor device package which accommodates power MOSFETs with a low on-resistance and a large rated current while preventing the increase in the size of the package can be provided.

Here, since the thickness of the power semiconductor device package is usually from about 2 mm through about 3 mm, and the thickness of one piece of a power MOSFET chip is about 150 μm through 200 μm, it can be said that the thickness of the power semiconductor device package remains substantially unchanged, even if the number of the MOSFET chips sealed in the package is increased by one, or, as described later, by two.

Figure 4:
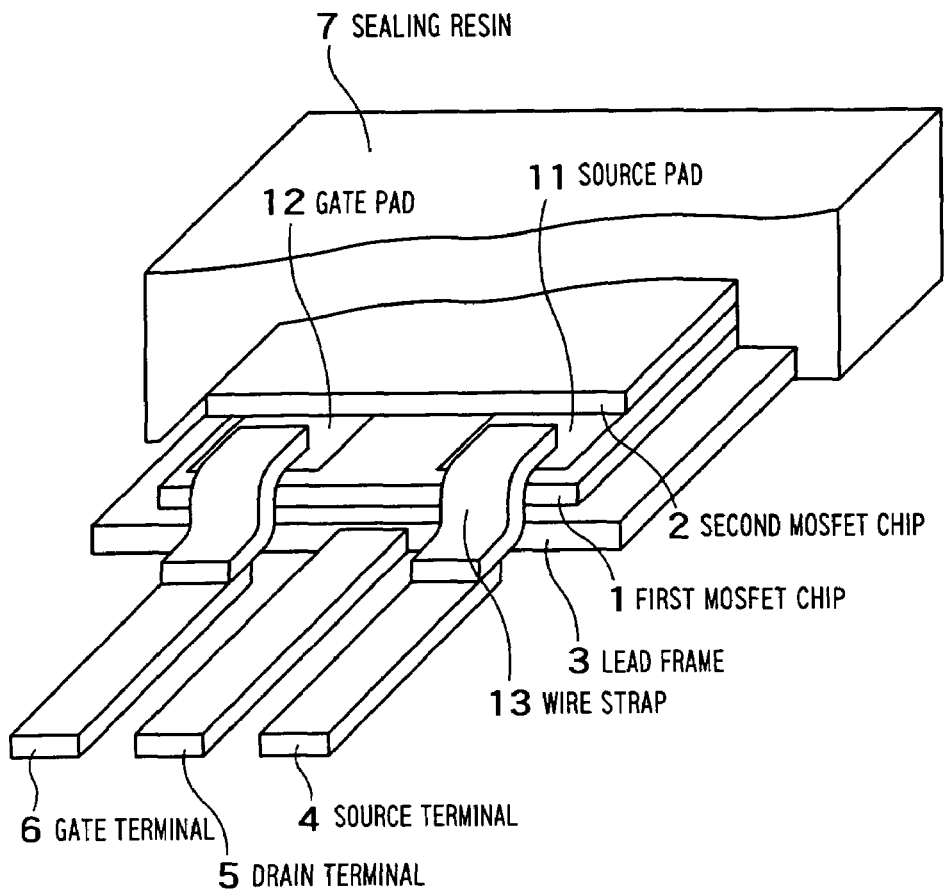
FIG. 4 is a partial cutaway perspective view showing the structure of a power semiconductor device package according to a second embodiment of the present invention.
Figure 5:
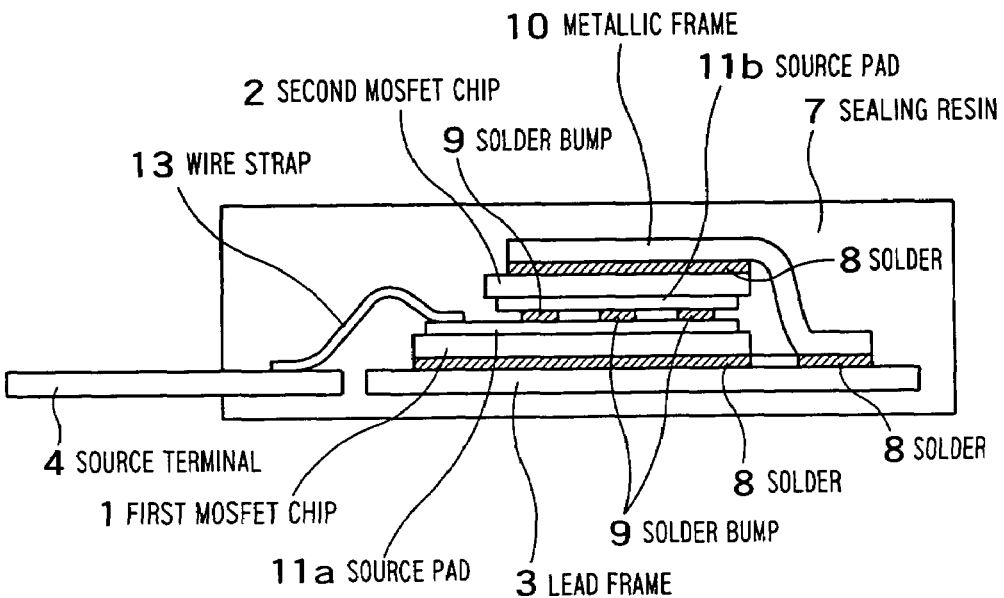
FIG. 5 is a cross sectional view showing the structure of the power semiconductor device package according to the second embodiment of the present invention.

FIG. 4 is a partial cutaway perspective view showing the structure of a power semiconductor device package according to the second embodiment of the present invention, and FIG. 5 is a cross sectional view showing the structure of the power semiconductor device package according to the second embodiment of the present invention.

The power semiconductor device package according to the second embodiment of the present invention comprises: a lead frame 3; a first power MOSFET chip 1 which is mounted on the lead frame 3 with solder 8; a drain terminal 5 which is extended from the lead frame 3, and connected to a drain electrode on the back of the first power MOSFET chip 1; a source pad 11*a* and a gate pad (not shown) formed on the first power MOSFET chip 1; a second power MOSFET chip 2 which is connected to the first power MOSFET chip 1 in parallel by connecting a source pad 11*b* and a gate pad (not shown) formed on the surface to the source pad 11*a* and the gate pad on the first power MOSFET chip 1 with solder bumps 9, respectively, and a drain electrode on the back to the lead frame 3 with a metallic frame 10 and the solder 8, and is arranged opposing to the first power MOSFET chip 1; wire straps 13 which connect the source pad 11*a* on the first power MOSFET chip 1 and a source terminal 4 as an external terminal, and the gate pad on the first power MOSFET chip 1 and a gate terminal 6 as an external terminal; and a sealing resin 7 in which components are sealed in a state that the tips of the source terminal 4, gate terminal 6, and drain terminal 5 are exposed.

In other words, the power semiconductor device package according to the second embodiment of the present invention comprises two power MOSFET chips, that is, a first and second power MOSFET chips 1 and 2, which are connected in parallel to each other by common connection of the electrode wirings with the solder bumps 9, while the power MOSFET chips are arranged as a laminated structure, opposing to each other, and the two chips are sealed in the sealing resin 7 as one body.

Though the configuration of the power semiconductor device package according to the second embodiment of the present invention has many points in common with that of the power semiconductor device package according to the first embodiment of the invention, a different point is that electrode wiring metallic plates 4 and 6 are not sandwiched between the first and second power MOSFET chips 1 and 2, and the source pad 11*a* and the gate pad on the first power MOSFET chip 1 are directly connected to the source pad 11*b* and the gate pad on the second power MOSFET chip 2 with solder bumps 9.

Therefore, the source pad 11*a* and the gate pad on the first power MOSFET chip 1 are connected to the source terminal 4 and the gate terminal 6 with the wire straps 13, respectively, in order to extend a source electrode wiring and a gate electrode wiring on the first and second power MOSFET chips 1 and 2 to the outside.

Since the electrode wiring metallic plates 4 and 6 are not sandwiched between the first and second power MOSFET chips 1 and 2, the manufacturing process technically becomes easy, and is simplified.

In order to secure a contact region in which the wire straps 13 are connected to the source pad 11*a* and the gate pad on the first power MOSFET chip 1, the chip area of the second power MOSFET chip 2 is slightly smaller than that of the first power MOSFET chip 1 in the power semiconductor device package according to the second embodiment of the invention.

Here, aluminum, copper, and the like can be used as a material for the wire strap 13.

As described above, since there is adopted the structure comprising the first and second power MOSFET chips 1 and 2, which are connected in parallel to each other by common connection of electrode wirings with the solder bumps 9, while the power MOSFET chips are arranged as a laminated structure, opposing to each other, and the two chips are sealed in the sealing resin 7 as one body, the on-resistance for the whole power semiconductor device as a single package can be reduced almost by half, assuming that the size of the package is hardly increased and the chip areas of the power MOSFET chips are approximately doubled, according to the power semiconductor device package of the second embodiment of the present invention.

Therefore, a power semiconductor device package which accommodates power MOSFETs with a low on-resistance and a large rated current while preventing the increase in the size of the package can be provided.

Figure 6:
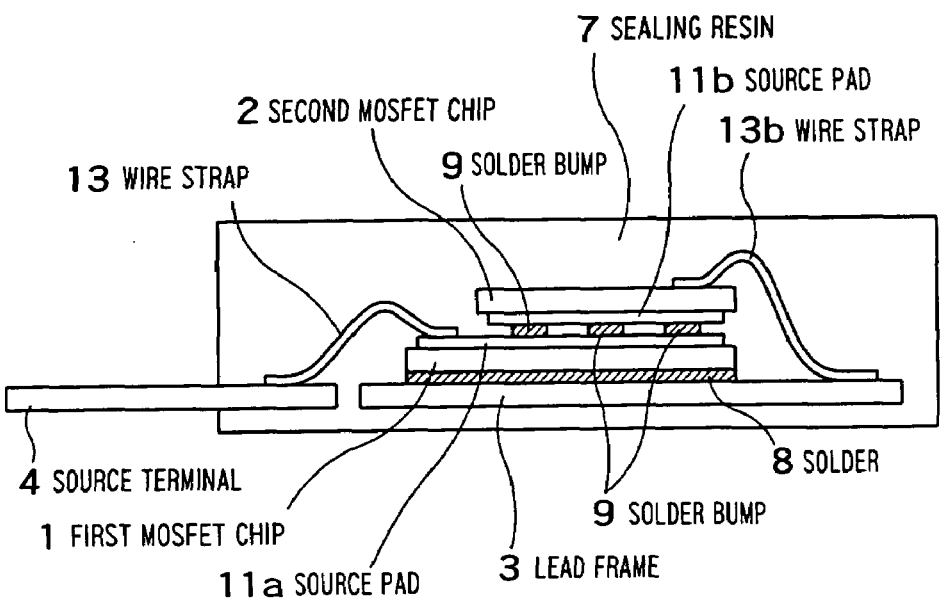
FIG. 6 is a cross sectional view showing the structure of a modification of the power semiconductor device package according to the second embodiment of the present invention.

FIG. 6 is a cross sectional view showing the structure of a modification of the power semiconductor device package according to the second embodiment of the present invention.

While the drain electrode on the back of the second power MOSFET chip 2 and the lead frame 3 are connected to each other with the metallic frame 10 and the solder 8 in the power semiconductor device package of the second embodiment of the present invention shown in FIGS. 4 and 5, the modification shown in FIG. 6 is different from the second embodiment in that the drain electrode and the lead frame 3 on the back of the second power MOSFET chip 2 are connected with the wire strap 13b. With regard to other parts, the configurations of the both embodiments are similar.

The manufacturing process can be further simplified by using the wire strap for connection between the drain electrode on the back of the second power MOSFET chip 2 and the lead frame 3 in a similar manner to connections by which the source pad 11a and the gate pad on the first power MOSFET chip 1 are connected to the source terminal 4 and the gate terminal 6, respectively.

Figure 7:
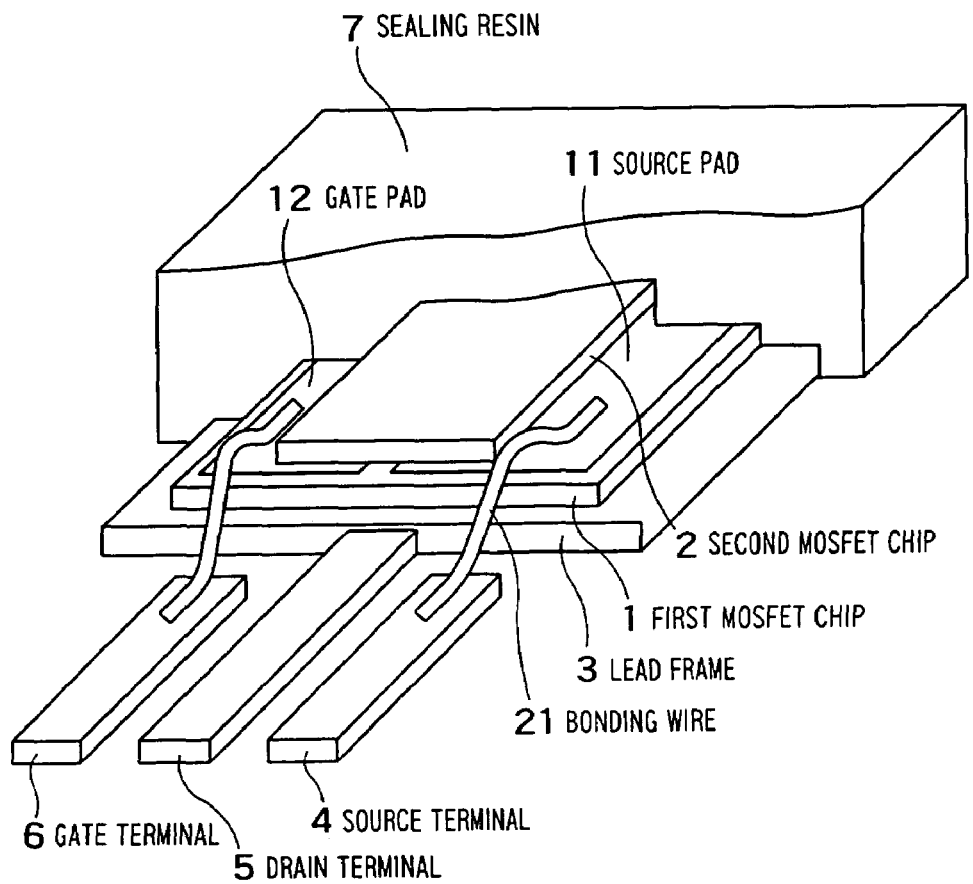
FIG. 7 is a partial cutaway perspective view showing the structure of a power semiconductor device package according to a third embodiment of the present invention.

FIG. 7 is a partial cutaway perspective view showing the structure of a power semiconductor device package according to a third embodiment of the present invention.

While the wire straps 13 are used for connection between the source pad 11a (refer to FIG. 5) on the first power MOSFET chip 1 and the source terminal 4, and connection between the gate pad on the first power MOSFET chip 1 and the gate terminal 4 in the power semiconductor device package of the second embodiment of the present invention shown in FIGS. 4 and 5, bonding wires 21 are used for the connection in the power semiconductor device package according to the third embodiment of the present invention shown in FIG. 7.

Since the electrode wiring metallic plates 4 and 6 are not sandwiched between the first and second power MOSFET chips 1 and 2, the manufacturing process technically becomes easy, and is simplified even in the power semiconductor device package according to the third embodiment of the invention.

Here, in order to secure a contact region in which the bonding wires 21 are connected to the source pad 11a and the gate pad on the first power MOSFET chip 1, the chip area of the second power MOSFET chip 2 is slightly smaller than that of the first power MOSFET chip 1 even in the power semiconductor device package according to the third embodiment of the invention.

Therefore, almost similar effects to those by the power semiconductor device package according to the second embodiment of the present invention can be obtained by the power semiconductor device package according to the third embodiment of the invention.

Figure 8:
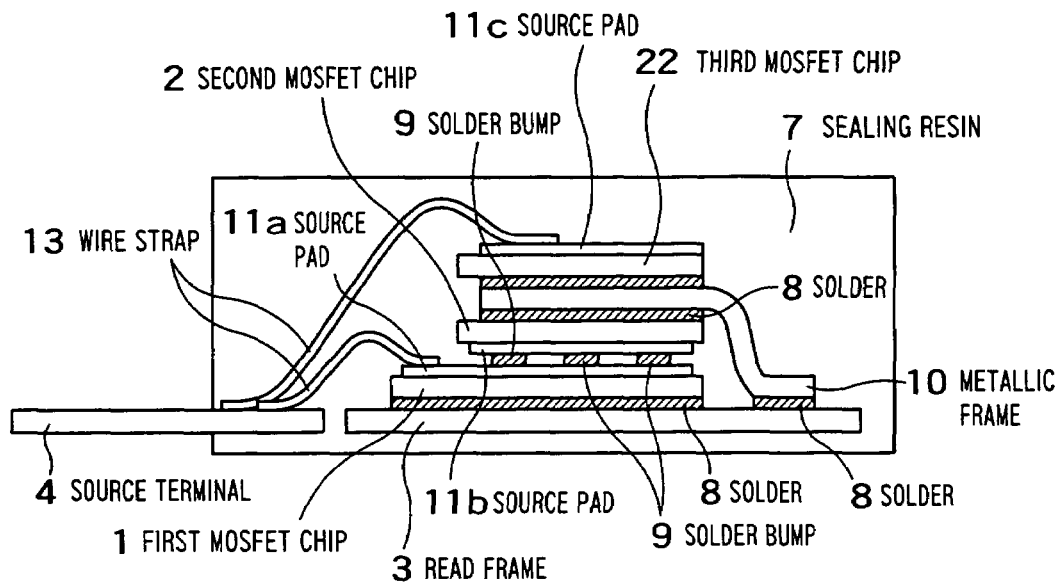
FIG. 8 is a cross sectional view showing the structure of a power semiconductor device package according to a fourth embodiment of the present invention.

FIG. 8 is a cross sectional view showing the structure of a power semiconductor device package according to a fourth embodiment of the present invention.

The power semiconductor device package according to the fourth embodiment of the present invention comprises: a lead frame 3; a first power MOSFET chip 1 which is mounted on the lead frame 3 with solder 8; a drain terminal (not shown) which is extended from the lead frame 3, and connected to a drain electrode on the back of the first power MOSFET chip 1; a source pad 11a and a gate pad (not shown) formed on the first power MOSFET chip 1; a second power MOSFET chip 2 which is connected to the first power MOSFET chip 1 in parallel by connecting a source pad 11b and a gate pad (not shown) formed on the surface to the source pad 11a and the gate pad on the first power MOSFET chip 1 with solder bumps 9, respectively, and a drain electrode on the back to the lead frame 3 with a metallic frame 10 and the solder 8, and is arranged opposing to the first power MOSFET chip 1; wire straps 13 which connect the source pad 11a on the first power MOSFET chip 1 and a source terminal 4 as an external terminal, and the gate pad on the first power MOSFET chip 1 and the gate terminal (not shown) as an external terminal; a third power MOSFET chip 22 which is connected to the first and second power MOSFET chips 1 and 2 in parallel by connecting a source pad 11c and a gate pad (not shown) formed on the surface to the source terminal 4 and the gate terminal with another wire straps 13, respectively, and by mounting a drain electrode on the back, which is connected, with solder 8, to a surface opposing to a surface of the metallic frame 10 to which the drain electrode on the back of the second power MOSFET chip 2 is connected with solder 8; and a sealing resin 7 in which components are sealed in a state that the tips of the source terminal 4, gate terminal 6, and drain terminal 5 are exposed.

In other words, the power semiconductor device package according to the fourth embodiment of the present invention comprises three power MOSFET chips, that is, the first, second, and third power MOSFET chips 1, 2, and 22 in which the three chips are successively arranged as a laminated structure, while the front side and the front side, and the back side and the back side are opposing to each other, respectively, and the three chips are connected in parallel to each other by common connection of the electrode wirings on the surface sides with solder bumps 9, and by common connection of the electrode wirings on the back sides with the metallic frame 10 and solders 8. Moreover, the three chips are sealed in the sealing resin 7 as one body.

Though the power semiconductor device packages according to the previous embodiments of the present invention have the configuration in which two power MOSFET chips are arranged as a laminated structure, while the front sides are opposing to each other, and the two chips are connected in parallel to each other and are sealed in the sealing resin 7 as one body, the power semiconductor device package according to the fourth embodiment of the present invention has the configuration in which three power MOSFET chips are successively arranged as a laminated structure, while the front side and the front side, and the back side and the back side are opposing to each other, respectively, and three chips are connected in parallel to each other and are sealed in the sealing resin 7 as one body.

In order to secure a contact region in which the wire straps 13 are connected to the source pad 11a and the gate pad on the first power MOSFET chip 1, the chip areas of the second and third power MOSFET chips 2 and 22 are slightly smaller than that of the first power MOSFET chip 1 in the power semiconductor device package according to the fourth embodiment of the present invention.

As described above, there is adopted the structure comprising the first, second and third power MOSFET chips 1, 2, and 22, which are successively arranged as a laminated structure, while the front side and the front side, and the back side and the back side are opposing to each other, respectively, and are connected in parallel to each other by common connection of the electrode wirings on the surface sides with solder bumps 9, and by common connection of the electrode wirings on the back sides with the metallic frame 10 and solders 8. Moreover, the three chips are sealed in the sealing resin 7 as one body. Accordingly, the on-resistance for the whole power semiconductor device as a single package can be remarkably reduced to almost one third, assuming that the size of the package is hardly increased and the chip areas of the power MOSFET chips are approximately tripled.

Therefore, a power semiconductor device package which accommodates power MOSFETs with a lower on-resistance, a large output capacity, and a high rated current while preventing the increase in the size of the package can be provided.

Here, bonding wires can be used instead of the wire straps 13 in the power semiconductor package according to the fourth embodiment of the present invention.

Figure 9:
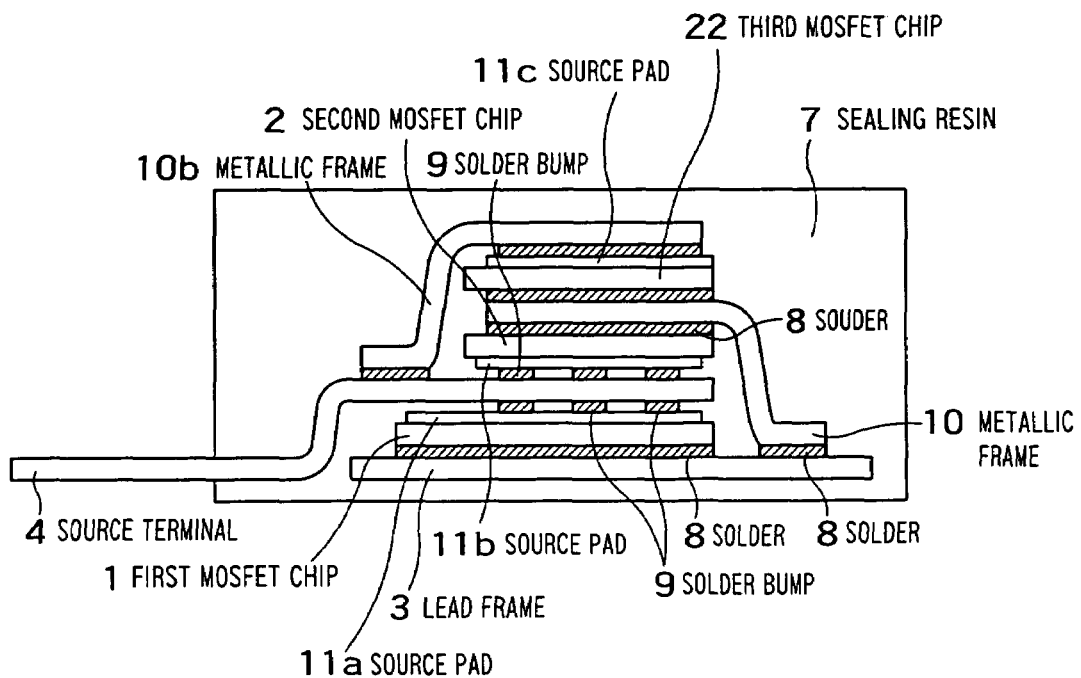
FIG. 9 is a cross sectional view showing the structure of a power semiconductor device package according to a fifth embodiment of the present invention.

FIG. 9 is a cross sectional view showing the structure of a power semiconductor device package according to a fifth embodiment of the present invention.

The power semiconductor device package according to the fifth embodiment of the present invention comprises: a lead frame 3; a first power MOSFET chip 1 which is mounted on the lead frame 3 with solder 8; a drain terminal (not shown) which is extended from the lead frame 3, and connected to a drain electrode on the back of the first power MOSFET chip 1; a source pad 11a and a gate pad (not shown) formed on the first power MOSFET chip 1; a source terminal 4 and a gate terminal (not shown) to which the source pad 11a and the gate pad on the first power MOSFET chip 1 are connected with solder bumps 9 at the one sides, respectively; a second power MOSFET chip 2 which is connected to the first power MOSFET chip 1 in parallel by connecting a source pad 11b and a gate pad (not shown) formed on the surface to the other sides of the source terminal 4 and the gate terminal with solder bumps 9, respectively, and a drain electrode on the back to the lead frame 3 with a metallic frame 10 and solder 8, and is arranged opposing to the first power MOSFET chip 1; a third power MOSFET chip 22 which is connected to the first and second power MOSFET chips 1 and 2 in parallel by connecting a source pad 11c and a gate pad (not shown) formed on the surface to the source terminal 4 and the gate terminal with another metallic frame 10b, and solder 8, respectively, and by mounting a drain electrode on the back, which is connected, with solder 8, to a surface opposing to a surface of the metallic frame 10 to which the drain electrode on the back of the second power MOSFET chip 2 is connected with solder 8; and a sealing resin 7 in which components are sealed in a state that the tips of the source terminal 4, gate terminal 6, and drain terminal 5 are exposed.

In other words, the power semiconductor device package according to the fifth embodiment of the present invention comprises three power MOSFET chips, that is, the first, second, and third power MOSFET chips 1, 2, and 22, wherein the first and second power MOSFET chips 1 and 2 are connected in parallel to each other by common connection of the electrode wirings on the surface sides to the electrode wiring metallic plates 4 and 6, and are arranged as a laminated structure, while the front sides between which the electrode wiring metallic plates 4 and 6 are sandwiched are opposing to each other, and the third power MOSFET chip 22 is connected in parallel to the second power MOSFET chip 2 by common connection of the electrode wirings on the back sides with the metallic frame 10 and the solder 8, while the third and second power MOSFET chips 22 and 2 are arranged as a laminated structure, and the back sides of the third and second power MOSFET chips 22 and 2 are opposing to each other. Moreover, the three chips are sealed in the sealing resin 7 as one body.

A common point between the power semiconductor device package according to the fifth embodiment of the present invention and that in the fourth embodiment of the present invention shown in FIG. 8 is that the three power MOSFET chips are successively arranged as a laminated structure, while the front side and the front side, and the back side and the back side are opposing to each other, respectively.

The difference is in that the electrode wirings on the surface of the first power MOSFET chip 1 and those on the surface of the second power MOSFET chip 2 are directly connected, with solder bumps 9, in the power semiconductor device package according to the fourth embodiment of the present invention, while the electrode wiring metallic plates 4 and 6 are sandwiched between the first and second power MOSFET chips 1 and 2, and the electrode wirings on the surface of the first power MOSFET chip 1 and those on the surface of the second power MOSFET chip 2 are connected to the electrode wiring metallic plates 4 and 6, respectively, in the power semiconductor device package according to the fifth embodiment of the present invention.

Furthermore, not the wire strap, but the metallic frame 10b is used for connection between the source pad 11c and the gate pad on the surface of the third power MOSFET chip 22 as the top layer chip and the source terminal 4 and the gate terminal, respectively, in the power semiconductor device package according to the fifth embodiment of the present invention.

Similar effects to those by the power semiconductor device package according to the fourth embodiment of the present invention can be obtained even by the power semiconductor device package according to the fifth embodiment of the invention. Moreover, since the same metallic plates are used for all the connecting members for respective sections, the manufacturing process can be simplified.

Figure 10:
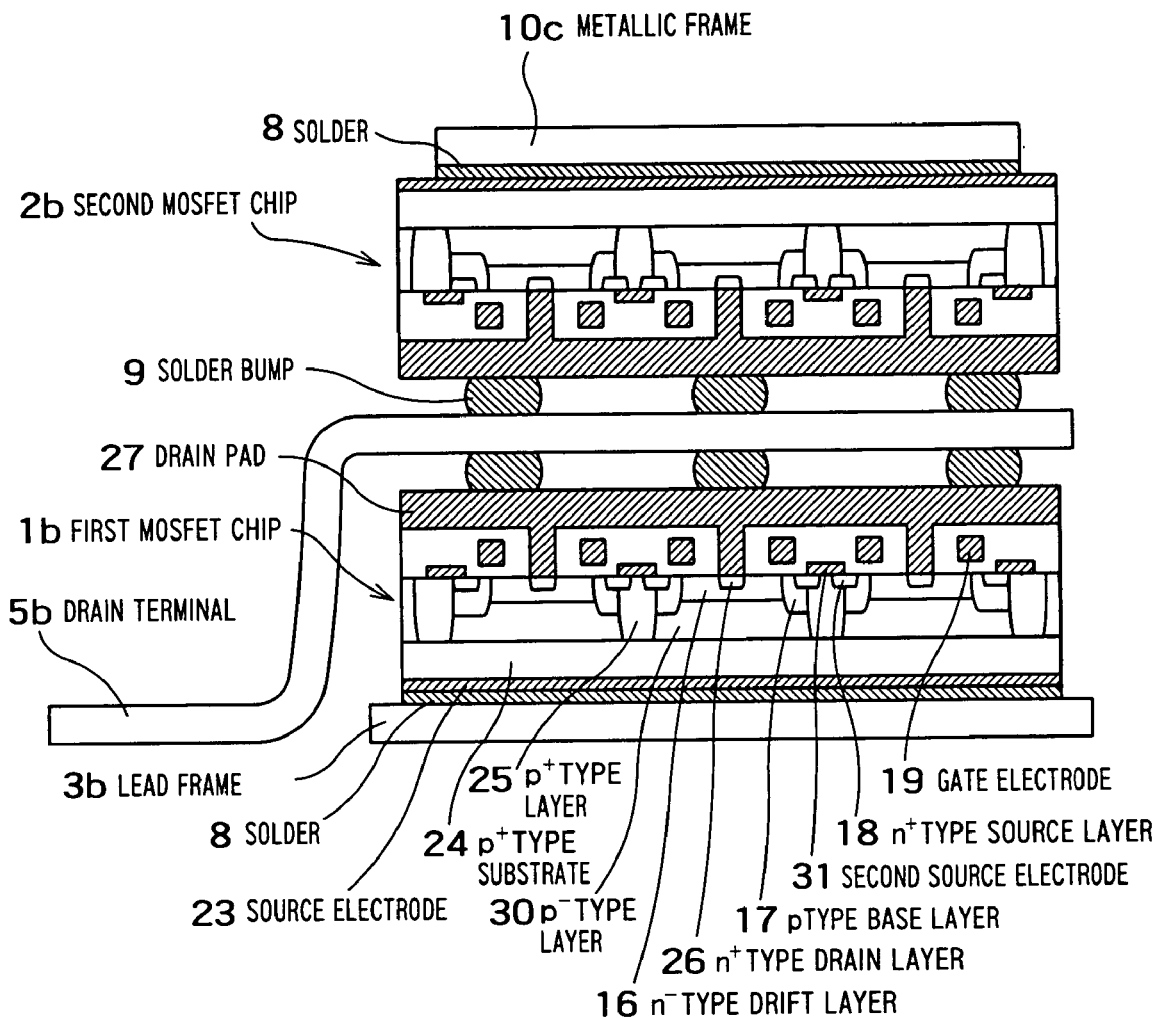
FIG. 10 is a partial sectional view showing one example of the structure of a power semiconductor device package according to a sixth embodiment of the present invention.
Figure 11:
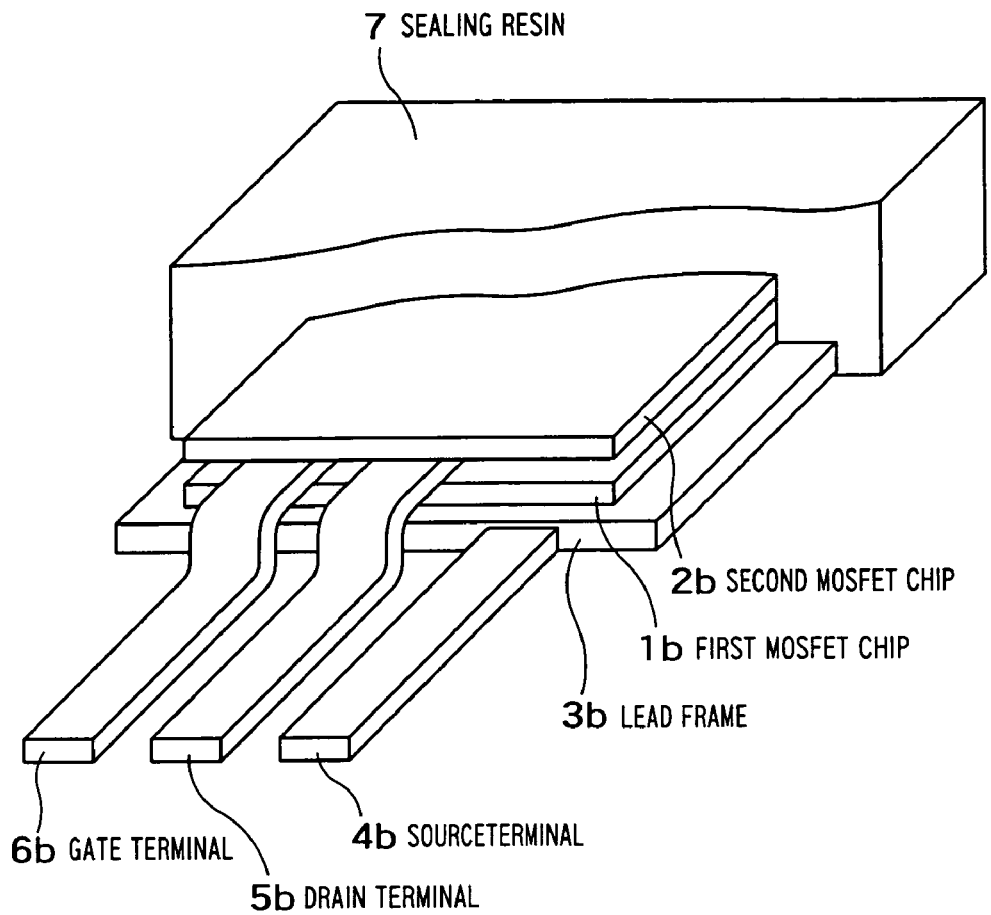
FIG. 11 is a partial cutaway perspective view showing the structure of the power semiconductor device package according to the sixth embodiment of the present invention.

FIG. 10 is a partial sectional view showing one example of the structure of a power semiconductor device package according to the sixth embodiment of the present invention, and FIG. 11 is a partial cutaway perspective view showing the structure of the power semiconductor device package according to the sixth embodiment of the present invention.

Though the power MOSFETs formed on the power MOSFET chips are assumed in the power semiconductor device packages according to the above-described embodiments of the present invention to be a vertical MOSFET shown in FIG. 3, the power MOSFETs formed on the power MOSFET chips can be configured to be a lateral MOSFET FIG. 10 shows a cross sectional structure for the part including two power MOSFET chips, among power semiconductor device packages according to the embodiments of the present invention when the lateral MOSFET is used, which are sealed in the sealing resin.

Though FIG. 10 shows a structure in which the electrode wiring metallic plates 4 and 6 are sandwiched between two power MOSFET chips, the power MOSFETs can be similarly configured to be a lateral MOSFET even when the electrode wirings are directly connected with solder bumps and the like without sandwiching the electrode wiring metallic plates 4 and 6 between the two chips. Moreover, though FIG. 10 shows only a cross sectional structure for the part including two power MOSFET chips, the power MOSFETs can be similarly configured to be a lateral MOSFET even when three power MOSFET chips are arranged as a laminated structure and sealed in a sealing resin as one body.

The first power MOSFET chip 1b comprises: a p+ type substrate 24; a p− type layer 30 formed on the p+ type substrate 24; an n− type drift layer 16 formed on the p− type layer 30; p type base layers 17 formed in the surface portion of the n− type drift layer 16; p+ type layers 25 formed in the p type base layers 17 and the p– type layer 30; n+ type source layers 18 formed in the surface portion including the boundaries between the p type base layers 17 and the layers 18; n+ type drain layers 26 formed in the surface portion of the n– type drift layer 16 between one p type base layer 17 and another p type base layer 17; a source electrode 23 which is formed on the back of the p+ type substrate 24 and is connected to the lead frame 3 with solder 8; second source electrodes 31 formed on the n+ type source layers 18 and the p+ type layers 25; gate electrodes 19 formed on the p type base layers 17 via insulating films; drain pads 27 formed so that the pads 27 are connected to the n+ type drain layers 26; and solder bumps 9 formed on the drain pads 27.

Though the second power MOSFET chip 2b has also a similar structure to that of the first power MOSFET chip 1b, the source electrode 23 of the second power MOSFET chip 2b is connected to the lead frame 3 with the metallic frame 10c and the solder 8.

Moreover, the first and second power MOSFET chips 1b and 2b are arranged so that the front sides are opposing to each other, and the drain terminal 5b and the gate terminal 6b are sandwiched between the two chips. The drain pads 27 and the gate pads of the first and second power MOSFET chips 1b and 2b are connected to the drain terminal 5b and the gate terminal 6b, respectively, with solder bump 9. Thereby, the first and second power MOSFET chips 1b and 2b are connected to each other in parallel, and the drain electrode wiring and the gate electrode wiring are extended to external terminals. Moreover, the source terminal 4b is connected to the lead frame 3, thereby, the source electrode wiring is extended to an external terminal.

In the lateral MOSFET, the source electrode and the drain electrode usually change positions in order to connect the substrate and the source electrode, different from the case of the vertical MOSFET.

That is, since the source electrode wiring and the gate electrode wiring are formed on the front side of the substrate as shown in FIG. 3, and the drain electrode wiring is formed on the back side of the substrate when the power MOSFET is a vertical MOSFET, the source terminal and the gate terminal are sandwiched between the two power MOSFET chips in which the surface sides are opposing to each other. On the other hand, since the drain electrode wiring and the gate electrode wiring are formed on the front side of the substrate as shown in FIG. 10, and the source electrode wiring is formed on the back side of the substrate when the power MOSFET is a lateral MOSFET, the drain terminal and the gate terminal are sandwiched between the two power MOSFET chips in which the surface sides are opposing to each other.

Though there are the above-described differences, similar effects to those of the power semiconductor device packages according to the above-described embodiments of the present invention can be obtained even in the power semiconductor device package according to the sixth embodiment of the present invention, that is, even in a case in which the power MOSFETs formed on the power MOSFET chips which are sealed in the package are a lateral MOSFET.

Figure 12:
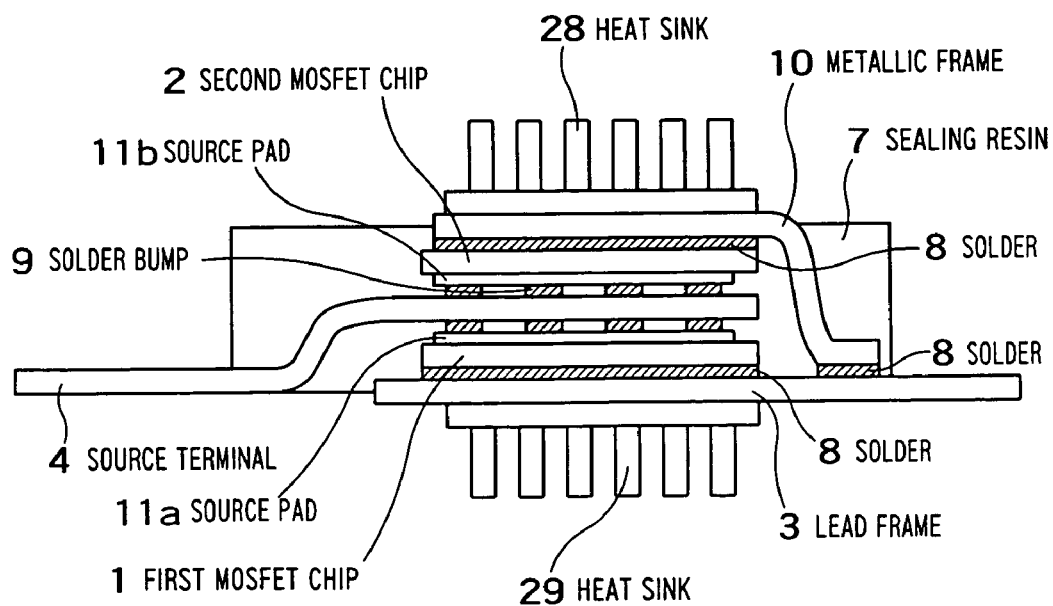
FIG. 12 is a cross sectional view showing the structure of a power semiconductor device package according to a seventh embodiment of the present invention.

FIG. 12 is a cross sectional view showing the structure of a power semiconductor device package according to a seventh embodiment of the present invention.

The power semiconductor device package according to the seventh embodiment of the present invention comprises: a lead frame 3; a first power MOSFET chip 1 which is mounted on the lead frame 3 with solder 8; a drain terminal 5 (refer to FIG. 1) which is extended from the lead frame 3, and connected to a drain electrode on the back of the first power MOSFET chip 1; a source pad 11a and a gate pad (not shown) formed on the first power MOSFET chip 1; a source terminal 4 and a gate terminal 6 (refer to FIG. 1) to which the source pad 11a and the gate pad on the first power MOSFET chip 1 are connected with solder bumps 9 at the one sides, respectively; a second power MOSFET chip 2 which is connected to the first power MOSFET chip 1 in parallel by connecting a source pad 11b and a gate pad (not shown) formed on the surface to the other sides of the source terminal 4 and the gate terminal 6 with solder bumps 9, respectively, and a drain electrode on the back to the lead frame 3 with a metallic frame 10 and solder 8, and is arranged opposing to the first power MOSFET chip 1; a sealing resin 7 in which components are sealed in a state that the tips of the source terminal 4, gate terminal 6, and drain terminal 5, the upper surface of the metallic frame 10, and the bottom of the lead frame 3 are exposed; first heat sinks 28 installed on the upper surface of the metallic frame 10; and second heat sinks 29 installed under the bottom surface of the lead frame 3.

The internal configuration of the power semiconductor device package according to the seventh embodiment of the present invention is quite similar to that of the power semiconductor device package according to the first embodiment of the present invention.

However, there is a difference between the power semiconductor device package according to the seventh embodiment and that according to the first embodiment of the present invention in that components are sealed in the sealing resin 7 in a state that the upper surface of the electrode wiring metallic plate as the top layer and the bottom of the electrode wiring metallic plate as the bottom layer, while the both metallic plates are connected to the first and second power MOSFET chips 1 and 2, respectively, that is, the upper surface of the metallic frame 10, and the bottom of the lead frame 3 are exposed, and the first and second heat sinks 28 and 29 are installed on the upper surface of the metallic frame 10, and under the bottom surface of the lead frame 3, respectively.

Accordingly, the power semiconductor device package according to the seventh embodiment of the present invention has similar effects to those of the power semiconductor device package according to the first embodiment of the present invention, and, furthermore, the first and second power MOSFET chips 1 and 2 in which heat is generated under operation can be effectively cooled by the first and second heat sinks 28 and 29.

Here, the first and second heat sinks 28 and 29 are not required to be installed in a direct manner on the upper surface of the electrode wiring metallic plate as the top layer and on the bottom of the electrode wiring metallic plate as the bottom layer, respectively, that is, on the upper surface of the metallic frame 10 and on the bottom of the lead frame 3, and an insulating member such as an insulating sheet may be inserted between the heat sinks and the electrode wiring metallic plates.

As described above, since the power semiconductor device packages according to the embodiments of the present invention are configured to comprise a plurality of power semiconductor chips which are arranged in a laminated structure so that the above-described plurality of power semiconductor chips are opposing to each other at the surfaces with the same electrical characteristics, and which are connected in parallel to one another and are sealed in a sealing resin as one body, a power semiconductor device package accommodating power MOSFETs with a small on-resistance, a large output capacity and a high rated current can be provided while preventing the increase in the size of the package.

Though the first to seventh embodiments according to the present invention have been explained as described above, the present invention is not limited to the above-described first to seventh embodiments. Though a planar gate MOSFET has been used for the above-described explanation in the above-described first to seventh embodiments, a trench gate MOSFET can be used therefor.

Moreover, the present invention can be realized, using a MOSFET with a super junction structure for the drift layer.

Furthermore, the present invention can be executed, using a package such as a TO-220 package, which has been used in the above-described first to seventh embodiments, or even a surface mounting package such as an SOP-8 package, and the invention is not limited by the size of a package, or the pattern of a lead frame.

Additionally, there may be applied a form in which two power MOSFET chips are arranged in a laminated structure so that the two chips are opposing to each other via the lead frame 3, that is, in a state that the lead frame 3 is sandwiched between the two chips, though the above-described first to seventh embodiments have illustrated a form in which two power MOSFET chips are arranged in a laminated structure so that the two chips are opposing to each other on the lead frame 3.

What is claimed is:

1. A power semiconductor device package comprising:
a plurality of power semiconductor chips which are arranged in a laminated structure so that said plurality of power semiconductor chips are opposing to each other at the surfaces with the same electrical structures, and which are connected in parallel to one another by connecting electrode wirings, which are formed on the surfaces opposing to each other, in a direct manner with a conductive member, said plurality of power semiconductor chips being sealed in a sealing resin as one body, a first electrode wiring formed on the bottom surface of a first power semiconductor chip as the bottom layer among said plurality of power semiconductor chips arranged in said laminated structure being connected to a lead frame, a second electrode wiring formed on the upper surface of a second power semiconductor chip as the top layer among said plurality of power semiconductor chips being connected to a metallic frame, a wire strap, or a bonding wire, which are connected to the lead frame, the electrode wirings formed on the surfaces, which are opposed to each other, of said plurality of power semiconductor chips being connected to external terminals, the lead frame being extended as an external electrode, and current flowing through each of said plurality of power semiconductor chips in a vertical direction of the laminated structure.

2. The power semiconductor device package according to claim 1, wherein said conductive member is a thermoplastic conductive member.

3. The power semiconductor device package according to claim 1, wherein the electrode wirings formed on the surfaces, which are opposing to each other, of said plurality of power semiconductor chips are connected to external terminals with wire straps or bonding wires.

4. The power semiconductor device package according to claim 1, wherein the first electrode wiring formed on the bottom surface of the first power semiconductor chip as the bottom layer among said plurality of power semiconductor chips arranged in said laminated structure is connected to the lead frame, and the second electrode wiring formed on the upper surface of the second power semiconductor chip as the top layer among said plurality of power semiconductor chips is connected to an external terminal to which an electrode wiring other than the first electrode wiring formed on the bottom surface of the power semiconductor chip as the bottom layer is connected.

5. The power semiconductor device package according to claim 1, wherein said plurality of power semiconductor chips are connected in parallel to one another by connecting the electrode wirings formed on surfaces opposing to each other to electrode wiring metallic plates, which are sandwiched between the electrode wirings, with a thermoplastic conductive member.

6. The power semiconductor device package according to claim 5, wherein the first electrode wiring formed on the bottom surface of the first power semiconductor chip as the bottom layer among said plurality of power semiconductor chips arranged in said laminated structure is connected to lead frame, and the second electrode wiring formed on the upper surface of the second power semiconductor chip as the top layer among said plurality of power semiconductor chips is connected to an external terminal to which an electrode wiring other than the first electrode wiring formed on the bottom surface of the power semiconductor chip as the bottom layer is connected.

7. The power semiconductor device package according to claim 5, wherein external terminals are extended from the electrode wiring metallic plates, which are sandwiched between the electrode wirings formed on the surfaces, which are opposing to each other, of said plurality of power semiconductor chips.

8. The power semiconductor device package according to claim 1, wherein said plurality of power semiconductor chips are MOSFETs with the same electrical structures.

9. The power semiconductor device package according to claim 8, wherein said plurality of power semiconductor chips are lateral MOSFETs.

10. The power semiconductor device package according to claim 8, wherein said plurality of power semiconductor chips are vertical MOSFETs.

11. The power semiconductor device package according to claim 1, wherein the sizes of said plurality of power semiconductor chips are different from each other.

12. The power semiconductor device package according to claim 11, wherein the electrode wirings formed on the surfaces, which are opposing to each other, of said plurality of power semiconductor chips are connected to external terminals with wire straps or bonding wires.

13. The power semiconductor device package according to claim 1, further comprising heat sinks which are installed in a direct or indirect manner on the upper surface of the second power semiconductor chip as the top layer of said laminated structure and on the bottom surface of the first power semiconductor chip as the bottom layer of said laminated structure, which are exposed from said sealing resin.

14. The power semiconductor device package according to claim 1, wherein said plurality of power semiconductor chips arranged in said laminated structure are two power semiconductor chips.

15. The power semiconductor device package according to claim 1, wherein said plurality of power semiconductor chips arranged in said laminated structure are three power semiconductor chips.

* * * * *